US007279908B2

(12) United States Patent
Blake

(10) Patent No.: US 7,279,908 B2
(45) Date of Patent: Oct. 9, 2007

(54) DYNAMICALLY SWITCHED LINE AND FAULT DETECTION FOR DIFFERENTIAL SIGNALING SYSTEMS

(75) Inventor: Christopher L. Blake, Lutz, FL (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/294,941

(22) Filed: Dec. 6, 2005

(65) Prior Publication Data

US 2007/0126431 A1 Jun. 7, 2007

(51) Int. Cl.
*G01R 27/04* (2006.01)

(52) U.S. Cl. ...................................... 324/647; 324/672

(58) Field of Classification Search ................ 324/540, 324/647, 672

See application file for complete search history.

(56) References Cited

U.S. PATENT DOCUMENTS 5,488,306 A * 1/1996 Bonaccio .................... 324/539
5,744,967 A * 4/1998 Sorensen .................... 324/540
6,373,262 B1 * 4/2002 Herring et al. ............. 324/647
6,894,505 B2 * 5/2005 Gohel ........................ 324/539
7,174,279 B2 * 2/2007 Conner ....................... 702/189

OTHER PUBLICATIONS

Abbott et al., Transmission Line Drivers and Receivers for TIA/EIA Standards RS-422 and RS-423, Aug. 1993, *National Semiconductor*, Application Note 214 (www.national.com), 1-12, Published in: US.

Fairchild Semiconductor, Application Note, ECL Backplane Design, Mar. 1991, Published in: US.

Swonger et al., Intersil, Using the HS-26C(T)31RH Radiation Hardened RS-422 Line Driver, Sep. 1995, (www.fairchildsemi.com), 1-8, Published in: US.

VO,A Comparison of Differential Termination Techniques, *National Semicondcutor*, Application Note 903 (www.national.com), Aug. 1993, 1-10, Published in: US.

Wilson, TIA/EIA-422 B Overview, *National Semiconductor*, Application Note 1031, (www.national.com), Jan. 2000, 1-8, Published in: US.

* cited by examiner

*Primary Examiner*—Walter Benson
(74) *Attorney, Agent, or Firm*—Fogg & Powers LLC

(57) ABSTRACT

A differential signaling system is provided. The differential signaling system comprises one or more cable pairs for carrying signals, one or more differential drivers for providing signals to the one or more cable pairs, and one or more differential receivers, the one or more differential receivers being coupled to the one or more differential drivers via the one or more cable pairs. The differential signaling system further comprises one or more test devices for testing the differential signaling system, and at least one switch coupled to at least one of the one or more cable pairs and to at least one of the one or more test devices, the switch being adapted to dynamically switch the at least one of the one or more test devices into a differential interface of the differential signaling system.

19 Claims, 4 Drawing Sheets

DYNAMICALLY SWITCHED LINE AND FAULT DETECTION FOR DIFFERENTIAL SIGNALING SYSTEMS

TECHNICAL FIELD

The present invention generally relates to signaling systems and, in particular, to differential signaling systems.

BACKGROUND

Differential signaling systems use cable pairs to carry a signal from a differential driver to a differential receiver. One cable carries the signal and the other cable carries an inverse of the signal. The receiver extracts the signal from the difference between the two signals. As a result, differential signaling systems are effective at rejecting noise in a signal because noise introduced on one cable will likely also be introduced on the other cable. Therefore, by focusing on the difference between the two signals, noise common to both cables is rejected. Additionally, differential signal systems are typically designed with redundant interfaces to limit the risk of complete failure (i.e. no data received) of the differential signaling system. In such cases, the redundant interface is enabled to replace the failed interface.

However, other problems may occur in a differential signaling system which do not cause a complete failure of the system but do degrade the quality of the signal received. For example, short or open circuits in only one cable and impedance changes along the transmission/reception path can lead to degradation of the differential interface. Since the system continues to function, albeit poorly or marginally, the problems are not detected and a redundant interface is not used. In addition, the source of these problems is often difficult to locate, especially since each distributed and lump impedance element along the transmission/reception path represents an opportunity for signal degradation.

For the reasons stated above, and for other reasons stated below which will become apparent to those skilled in the art upon reading and understanding the present specification, there is a need in the art for a differential signaling system that can effectively detect and diagnose problems not resulting in complete failure of the system.

SUMMARY

The above-mentioned problems and other problems are resolved by the present invention and will be understood by reading and studying the following specification.

In one embodiment, a differential signaling system is provided. The differential signaling system comprises one or more cable pairs for carrying signals, one or more differential drivers for providing signals to the one or more cable pairs, and one or more differential receivers, the one or more differential receivers being coupled to the one or more differential drivers via the one or more cable pairs. The differential signaling system further comprises one or more test devices for testing the differential signaling system, and at least one switch coupled to at least one of the one or more cable pairs and to at least one of the one or more test devices, the switch being adapted to dynamically switch the at least one of the one or more test devices into a differential interface of the differential signaling system.

In another embodiment, a method of manufacturing a differential signaling system is provided. The method comprises coupling a differential driver to a differential receiver via a cable pair, coupling a switch to the cable pair, and coupling at least one test device to the switch, wherein the switch enables the test device to be switched into a differential interface of the differential signaling system.

In another embodiment, a method of dynamically testing a differential interface of a differential signaling system is provided. The method comprises switching at least one test device into a differential interface of the differential signaling system, and testing characteristics and problems in the differential interface when the at least one test device is switched into the differential interface.

In yet another embodiment, a line testing differential driver is provided. The line testing differential driver comprises at least one pair of line terminals for coupling the differential driver to a cable pair in a differential signaling system, at least one test device terminal for coupling at least one test device to the differential driver, a signal generator for generating a signal to be emitted over the cable pair, and a switch adapted to toggle coupling the at least one pair of line terminals to the signal generator and coupling the at least one pair of line terminals to the at least one test device terminal for coupling at least one test device to the at least one pair of line terminals.

In another embodiment, a differential system is provided. The differential system comprises means for coupling a differential driver to a differential receiver forming part of a differential interface, and means for switching a test device into the differential interface.

DRAWINGS

DETAILED DESCRIPTION

Figure 1:
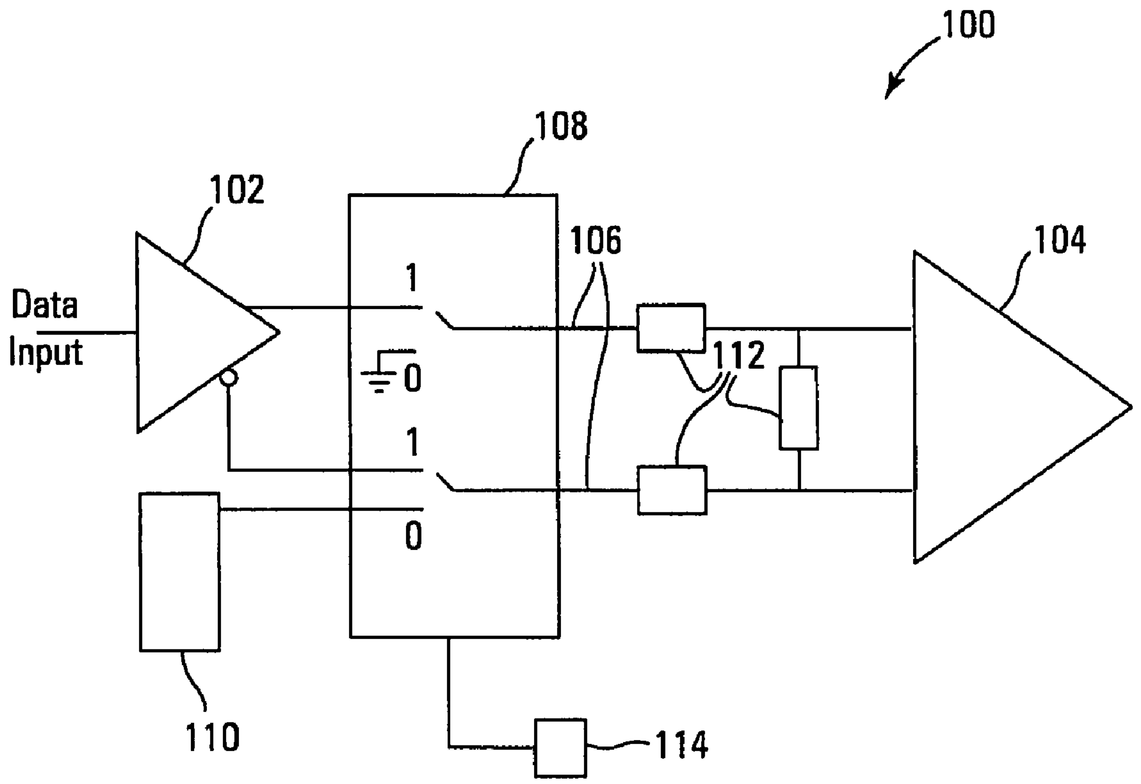
FIG. 1 is a block diagram of a differential signaling system according to one embodiment of the present invention.

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. It should be understood that the exemplary method illustrated may include additional or fewer steps or may be performed in the context of a larger processing scheme. Furthermore, the method presented in the drawing figures or the specification is not to be construed as limiting the order in which the individual steps may be performed. The following detailed description is, therefore, not to be taken in a limiting sense.

Embodiments of the present invention enable detection of problems, such as short or open circuits, which do not result in complete failure of the differential signaling system. In addition, embodiments of the present invention enable detection of these kinds of problems without requiring that personnel physically inspect the entire line. Embodiments of the present invention enable test devices to periodically test the line for these kind of problems and provide information for simplified detection, diagnosis and location of the problems.

FIG. 1 is a block diagram of a differential signaling system 100 according to one embodiment of the present invention. Differential signaling system 100 includes standard differential driver 102, cable pair 106, differential receiver 104 and impedance elements 112. It will be understood by one of skill in the art that any medium suitable for transmission and reception of signals is used for cable pair 106. Such mediums include, but are not limited to, fiber optic cable, coaxial cable, copper wire, etc. It will further be understood by one of skill in the art that each of impedance elements 112 are characterized in various embodiments by both lump and distributed impedance elements. Additionally, each of impedance elements 112 is one of resistive, capacitive and inductive in nature. Although only three impedance elements 112 are shown in FIG. 1, it will be understood by one of skill in the art that varying numbers of impedance elements 112 are used in varying embodiments of the present invention.

Differential driver 102 provides data signals to cable pair 106 for transmission to differential receiver 104. In some embodiments, more than one differential driver 102 is used. Likewise, in some embodiments, more than one differential receiver 104 is used. In such embodiments, each differential driver 102 is coupled to at least one cable pair 106. Likewise, in some embodiments, each differential receiver 104 is coupled to at least one differential driver 102 via at least one cable pair 106.

Differential signaling system 100 also includes test device 110 and switch 108. Switch 108 is coupled to both test device 110 and cable pair 106. Switch 108 is adapted to dynamically switch test device 110 into the differential interface. For example, as shown in FIG. 1, switch 108 dynamically switches the connection of cable pair 106 such that differential driver 102 is replaced by test device 110. As shown in FIG. 1, switch 108 decouples each cable of cable pair 106 from differential driver 102. Switch 108 then couples one cable of cable pair 106 to test device 110 and the other cable to ground. In some embodiments switch 108 is implemented as a high speed analog switch which minimizes impedance effects of switch 108 on differential signaling system 100. In other embodiments, switch 108 is implemented as other types of switches including, but not limited to, mechanical, optical, electrical and other existing or later developed switching technologies. In addition, in some embodiments more than one switch 108 is used. Furthermore, although the embodiment shown in FIG. 1 switches in test device 110 in place of differential driver 102, it will be understood by one of skill in the art that switch 108 is adaptable to be placed in any physical location in the differential interface and to switch out varying components of the differential interface. For example, in some embodiments, switch 108 is placed next to differential receiver 104 to dynamically connect differential receiver 104 to test device 110 and switch out other components of the differential interface. In other embodiments, switch 108 is placed such that differential driver 102 is dynamically connected to test device 110 while other components are switched out of the differential interface.

In some embodiments, differential signaling system 100 includes switch control 114 for manually controlling when switch 108 is toggled. Switch control 114 enables switching in test device 110 on demand. Additionally, in some embodiments, switch 108 is adapted to switch in test device 110 automatically at a determined time. The determined time is implemented in some embodiments as one of a set number of hours after starting operation of the switch and a set time and day, the time being tracked by an internal clock. Similarly, in some embodiments, switch 108 automatically switches in test device 110 periodically at a determined periodic rate. This periodic rate is, in some embodiments, hard coded in switch 108. In other embodiments, the periodic rate is changeable.

While switched in, test device 110 is capable of testing the differential interface of differential signaling system 100. As noted above, switch 108 is adaptable to be placed in any physical location in the differential interface. This enables varying components of the differential interface to be tested by different testing devices. In some embodiments, test device 110 is implemented as one of a vector impedance meter, a standing wave ratio analyzer, and a time domain reflectometer. In other embodiments, test device 110 is implemented as other devices such as a voltage divider. It will be understood by one of skill in the art that in other embodiments, test device 110 is implemented as yet other test devices.

Figure 2:
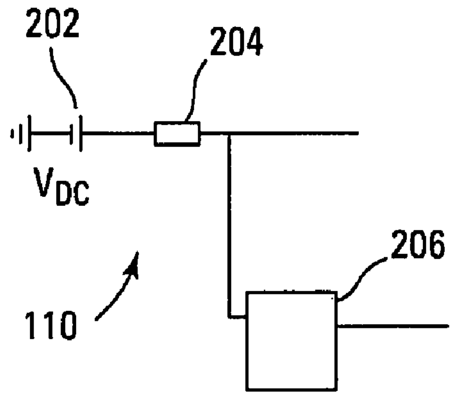
FIG. 2 is a block diagram of an exemplary test device for testing a differential signaling system according to one embodiment of the present invention.

In some embodiments, test device 110 includes an analog-to-digital converter for converting the analysis results to a digital signal and outputting the digital analysis signal. In some embodiments, the analysis signal is output to a monitoring point or station (not shown). Each different implementation of test device 110 is adapted to test different characteristics and problems in the differential interface. For example, a vector impedance meter measures the magnitude and phase of impedance in the differential signaling system while a standing wave ratio analyzer indicates if there are reflected waves reflecting back and forth within the differential signaling system. Such analysis enables detection of problems such as poor or marginal connections, cable degradations, and impedance variations which can result in increased bit error rates and reduced signal-to-noise ratios. Each of these problems may degrade the quality of the signal received at differential receiver 104 while not causing differential signaling system 100 to fail. However, embodiments of the present invention enable detection and diagnosis of these problems FIG. 2 is a block diagram of an exemplary test device 110 for testing a differential signaling system 100 according to one embodiment of the present invention. In some embodiments, as shown in FIG. 2, test device 110 comprises DC voltage source 202, resistor 204, and analog-to-digital converter (ADC) 206. Voltage source 202 provides a known voltage across resistor 204 to differential signaling system 100. The resistance value of resistor 204 is also known. Therefore, by knowing the voltage and resistor value of resistor 204, test device 110 in FIG. 2 forms a voltage divider which can be used to check DC characteristics of differential signaling system 100 for opens, shorts, bad connections, wrong resistor values, etc. The signal resulting from providing a voltage to differential system 100 from source 202 is transmitted to a monitoring point or station (not shown) which analyzes the signal to determine the existence of opens, shorts, etc. In some embodiments, ADC 206 converts the signal to a digital signal prior to receipt of the signal at a monitoring point or station. In other embodiments, ADC 206 is not included and an analog signal is received by a monitoring point or station.

Figure 3:
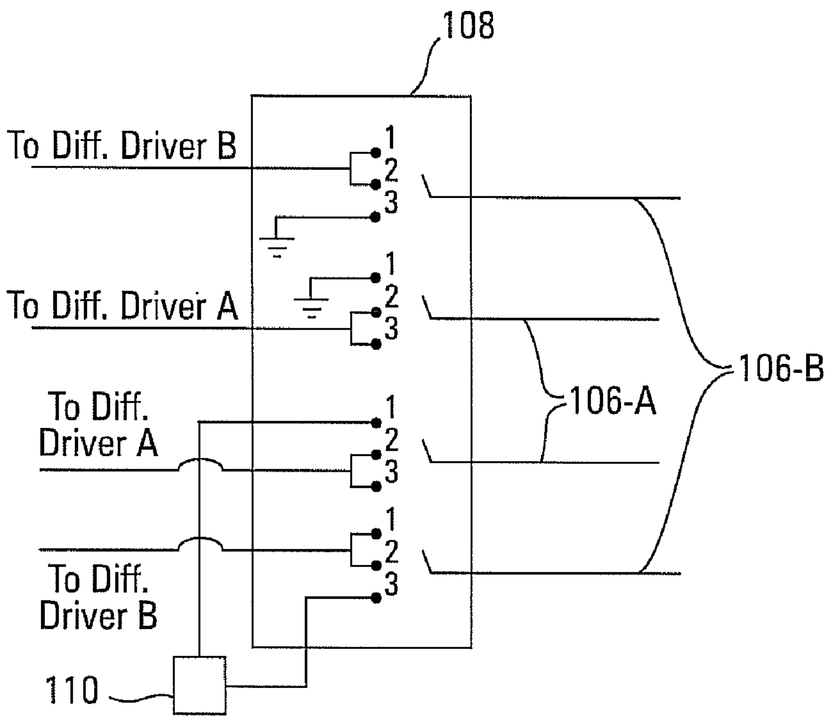
FIG. 3 is an exemplary switch according to one embodiment of the present invention.

FIG. 3 is a block diagram of an exemplary switch 108 according to one embodiment of the present invention. Switch 108 in FIG. 3 is adapted to support one or more cable pairs 106. Although only two cable pairs 106-A and 106-B are shown in FIG. 3, it will be understood by one of skill in the art that other numbers of pairs are used in other embodiments. Each of cable pairs 106-A and 106-B is coupled to a differential driver as shown in FIG. 1 via switch 108. In the embodiment in FIG. 3, cable pair 106-A is coupled to differential driver A and cable pair 106-B is coupled to differential driver B. In some embodiments, differential driver A and differential driver B are the same differential driver. In other embodiments, differential driver A and differential driver B are separate differential drivers.

Switch 108 is also coupled to test device 110. Switch 108 is an M-pole, N-throw switch (throw referring herein to the number of possible switch positions). Switch 108 is used to dynamically switch test device 110 into one or more cable pairs 106 for testing a differential interface along more than one cable pair 106 with one test device 110. In other embodiments, a plurality of test devices 110 are used, each test device 110 testing the differential interface along each cable pair 106. In the embodiment in FIG. 3, switch 108 is a 4-pole, 3-throw (4P3T) switch. However, it will be understood by one of skill in the art that a switch with an appropriate number of N-throws and M-poles is used in other embodiments. Similarly, it will be understood by one of skill in the art that in other embodiments, other configurations of switch 108 are used to perform the same and similar functions as those described herein with respect to the embodiment in FIG. 3.

In FIG. 3, switch 108 has 3 positions labeled 1, 2, and 3. Each cable in cable pairs 106-A and 106-B are switched to be coupled to the same numbered position. As shown, when switch 108 couples cable pairs 106-A and 106-B to position 2, both cable pairs 106-A and 106-B are coupled to their respective differential drivers. When switch 108 couples cable pairs 106-A and 106-B to position 1, cable pair 106-A is coupled to test device 110 and cable pair 106-B is coupled to differential driver B. When switch 108 couples cable pairs 106-A and 106-B to position 3, cable pair 106-A is coupled to differential driver A and cable pair 106-B is coupled to test device 110. In this manner one test device is used to test the differential interface along more than one cable pair 106.

Figure 4:
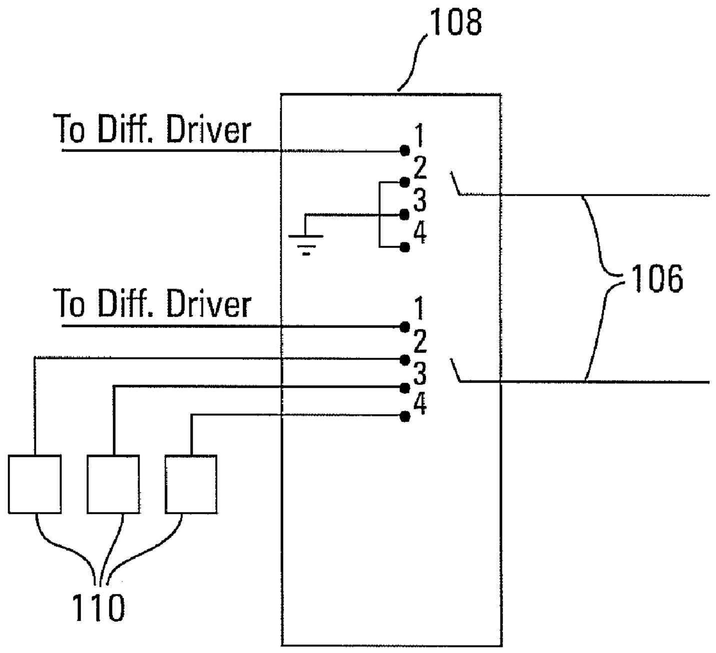
FIG. 4 is an exemplary switch according to another embodiment of the present invention.

FIG. 4 is a block diagram of an exemplary switch 108 according to another embodiment of the present invention. Switch 108 couples cable pair 106 to a differential driver as shown in FIG. 1. Switch 108 in FIG. 4 is also coupled to a plurality of test devices 110. Switch 108 is an M-pole, N-throw switch for switching in a plurality of test devices. In some embodiments, switch 108 couples cable pair 106 to only one of the plurality of test devices 110 at a time. In some embodiments, each of the plurality of test devices 110 tests different characteristics of differential signaling system 100. In other embodiments, one or more of the plurality of test devices is the same as another test device providing redundant test devices. By enabling the use of one switch 108 to couple cable pair 106 to a plurality of test devices 110, the ability of embodiments of the present invention to detect problems in differential signaling system 100 is increased by enabling testing of different characteristics of the differential interface.

In the embodiment in FIG. 4, switch 108 is a 2-pole, 4-throw (2P4T) switch for switching in 3 different test devices. However, it will be understood by one of skill in the art that a switch with an appropriate number of N-throws and M-poles is used in other embodiments. In addition, although only 3 test devices 110 are shown in FIG. 4, it will be understood by one of skill in the art that other numbers of test devices are used in other embodiments. Both cables of cable pair 106 are coupled to the same numbered position at substantially the same time. When coupled to position 1, cable pair 106 is coupled to a differential driver. When coupled to one of positions 2, 3, and 4, one of test devices 110 is coupled to cable pair 106. It will be understood by one of skill in the art that in other embodiments, other configurations of switch 108 are used to perform the same and similar functions as those described herein with respect to the embodiment in FIG. 4.

In some embodiments of the present invention, a switch is used which combines functions shown in FIGS. 3 and 4. For example, in some embodiments, a switch is adapted to alternate coupling each of more than one cable pairs to one or more differential drivers and coupling each of the more than one cable pairs to each of a plurality of test devices. Additionally, in some embodiments, more than one switch is used in a differential signaling system.

It will be understood by one of skill in the art that varying embodiments of the present invention are implemented with one or more combinations of drivers 102, wire pairs 106, receivers 104, switches 108 and test devices 110. Switching configurations of the varying embodiments of the present invention are of sufficient complexity to substantially enable any desired testing of a differential signaling system. The physical location of one or more switches 108 is placed anywhere along the differential signaling system interface to enable the testing desired.

Figure 5:
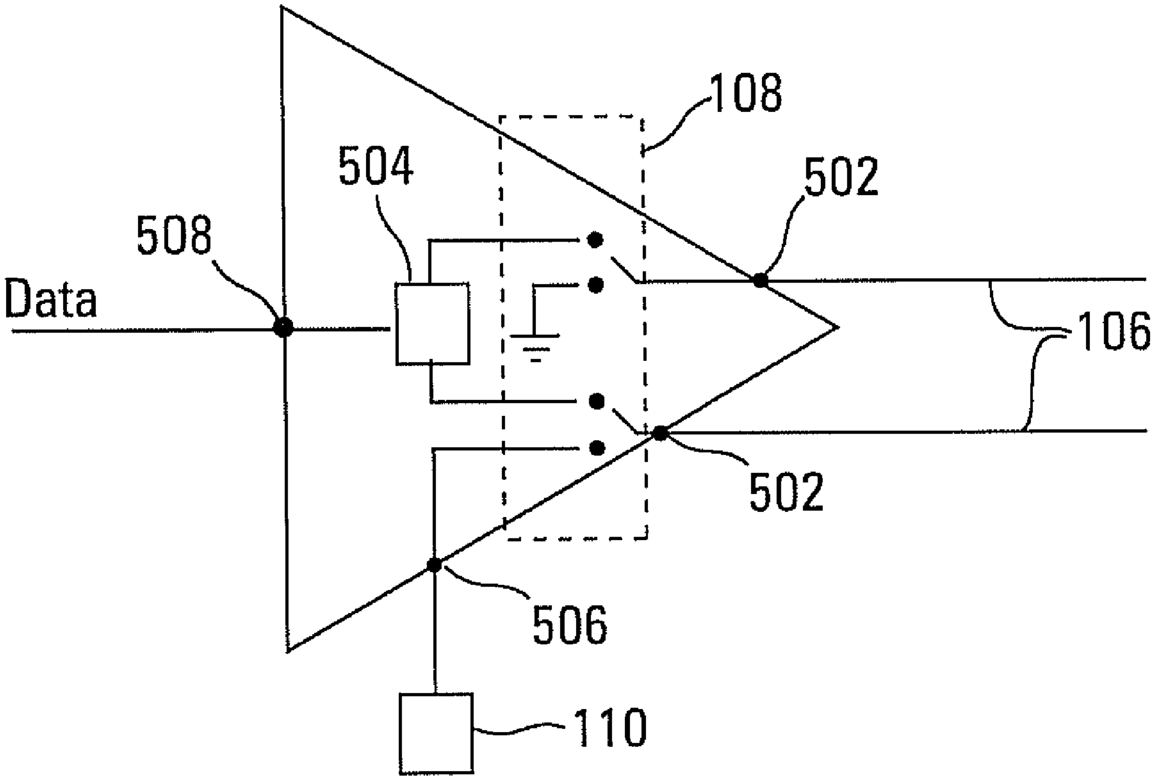
FIG. 5 is a diagram of a line testing differential driver according to one embodiment of the present invention.

FIG. 5 is a diagram of a line testing differential driver 500 according to one embodiment of the present invention. In some embodiments, such as in FIG. 5, switch 108 is incorporated in differential driver 500. In such embodiments, differential driver 500 includes line terminals 502 for coupling differential driver 500 to cable pair 106 in differential signaling system 100, signal generator 504 for generating a signal emitted over cable pair 106, data terminal 508 for receiving data to be transmitted, and test device terminal 506 for coupling test device 110 to cable pair 106. Switch 108 in differential driver 500 alternates between coupling cable pair 106 to signal generator 504 and coupling cable pair 106 to test device terminal 506. Additionally, in some such embodiments, test device 110 is also incorporated in differential driver 500.

Figure 6:
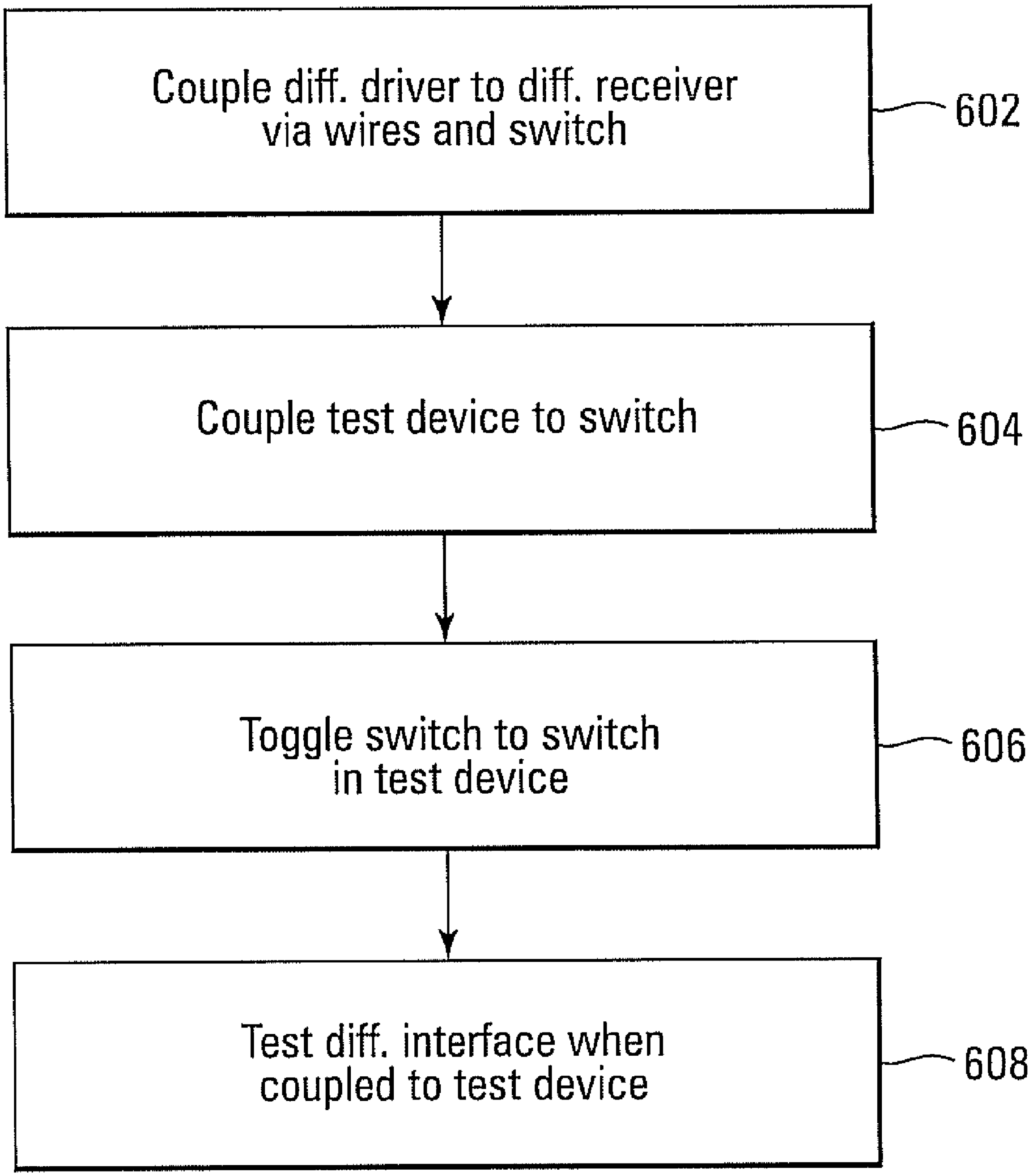
FIG. 6 is a flow chart showing a method of dynamically testing a differential interface of a differential signaling system.

FIG. 6 is a flow chart showing a method 600 of dynamically testing a differential interface of a differential signaling system. At 602, a differential driver is coupled to a differential receiver via a cable pair and a switch to complete a differential interface of a differential signaling system. At 604, at least one test device is coupled to the switch. In different embodiments, different test devices are used as described above with regards to FIGS. 1 and 2. At 606, the switch is toggled such that the at least one test device is switched into the differential interface as described above with regards to FIGS. 1-5. In some embodiments, when to toggle the switch is controlled manually. In other embodiments, the switch is toggled automatically at a determined time. In yet other embodiments, the switch is periodically toggled automatically at a determined periodic rate. At 608, the at least one test device tests the differential interface for problems when the cable pair is coupled to the test device.

Although specific embodiments have been illustrated and described herein, it will be appreciated by those of ordinary skill in the art that any arrangement, which is calculated to achieve the same purpose, may be substituted for the specific embodiment shown. For example, although embodiments shown in the drawings discuss switching in a test device in place of a differential driver, it will be understood by one of skill in the art that in other embodiments, a test device is switched in the place of other components, such as a differential receiver. This application is intended to cover any adaptations or variations of the present invention. Therefore, it is manifestly intended that this invention be limited only by the claims and the equivalents thereof.

What is claimed is:

1. A differential signaling system, comprising:

one or more cable pairs for carrying signals;

one or more differential drivers for providing signals to the one or more cable pairs;

one or more differential receivers, the one or more differential receivers being coupled to the one or more differential drivers via the one or more cable pairs;

one or more test devices for testing the differential signaling system; and at least one switch coupled to at least one of the one or more cable pairs and to at least one of the one or more test devices, the switch being adapted to dynamically switch the at least one of the one or more test devices into a differential interface of the differential signaling system; wherein switching the at least one test device into the differential interface replaces at least one component of the differential interface with the at least one test device.

2. The differential signaling system of claim 1, wherein the at least one test device comprises one of a vector impedance meter, a standing wave ratio analyzer, and a time domain reflectometer.

3. The differential signaling system of claim 1, wherein the at least one test device further comprises:

a voltage source adapted to provide a reference voltage; and a resistor coupled to the voltage source having a determined resistance value, the voltage source and resistor together forming a voltage divider for testing a differential interface of the differential signaling system.

4. The differential signaling system of claim 1, wherein the at least one test device further comprises:

a plurality of test devices, wherein the switch is further adapted to dynamically switch the plurality of test devices into a differential interface of the differential signaling system.

5. The differential signaling system of claim 1, wherein the switch further comprises a high speed analog switch which minimizes impedance effects of the switch on the differential signaling system.

6. The differential signaling system of claim 1, further comprising:

a manual control for manually causing the switch to switch the at least one of the one or more test devices into a differential interface of the differential signaling system.

7. The differential signaling system of claim 1, wherein the switch is further adapted to automatically switch the at least one of the one or more test devices into a differential interface of the differential signaling system at a determined time.

8. The differential signaling system of claim 7, wherein the switch is further adapted to periodically switch the at least one of the one or more test devices into a differential interface of the differential signaling system at a determined periodic rate.

9. A method of manufacturing a differential signaling system, the method comprising:

coupling a differential driver to a differential receiver via a cable pair;

coupling a switch to the cable pair; and coupling at least one test device to the switch, wherein the switch enables the test device to be switched into a differential interface of the differential signaling system to replace at least one component of the differential interface with the at least one test device.

10. A method of dynamically testing a differential interface of a differential signaling system, the method comprising:

switching at least one test device into a differential interface of the differential signaling system, wherein switching the at least one test device into the differential interface replaces at least one component of the differential interface with the at least one test device; and testing characteristics and problems in the differential interface when the at least one test device is switched into the differential interface.

11. The method of claim 10, wherein switching at least one test device into a differential interface further comprises:

controlling manually when the test device is switched into a differential interface of the differential signaling system.

12. The method of claim 10, wherein switching at least one test device into a differential interface further comprises:

switching a plurality of test devices into a differential interface one at a time.

13. The method of claim 10, wherein switching at lest one test device into a differential interface further comprises:

automatically switching at least one test device into a differential interface at a determined time.

14. The method of claim 13, wherein automatically switching at least one test device into a differential interface at a determined time further comprises:

automatically switching at least one test device into a differential interface periodically at a determined periodic rate.

15. A line testing differential driver comprising:

at least one pair of line terminals for coupling the differential driver to a cable pair in a differential signaling system;

at least one test device terminal for coupling at least one test device to the differential driver;

a signal generator for generating a signal to be emitted over the cable pair; and a switch adapted to toggle coupling the at least one pair of line terminals to the signal generator and coupling the at least one pair of line terminals to the at least one test device terminal for coupling at least one test device to the at least one pair of line terminals.

16. The line testing differential driver of claim 15, wherein the switch further comprises a high speed analog switch which minimizes impedance effects of the switch in the cable pair.

17. The line testing differential driver of claim 15, further comprising:

a test device, the test device being an integral part of the line testing differential driver.

18. A differential signaling system comprising:

means for coupling a differential driver to a differential receiver forming part of a differential interface; and means for switching a test device into the differential interface, wherein the means for switching is configured to replace a component of the differential interface with the test device when switching the test device into the differential interface.

19. The differential signaling system of claim 18, further comprising:

means for manually switching a test device into the differential interface.

* * * * *